United States Patent
Lee

(10) Patent No.: US 6,233,196 B1
(45) Date of Patent: May 15, 2001

(54) MULTI-BANK INTEGRATED CIRCUIT MEMORY DEVICES WITH DIAGONAL PAIRS OF SUB-BANKS

(75) Inventor: Kyu-chan Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/351,718

(22) Filed: Jul. 12, 1999

(30) Foreign Application Priority Data

Jan. 9, 1998 (KR) ................................. 98-35851

(51) Int. Cl.$^7$ ........................................ G11C 8/00
(52) U.S. Cl. ........................ 365/230.03; 365/51
(58) Field of Search ..................... 365/230.03, 51, 365/63, 230.04

(56) References Cited

U.S. PATENT DOCUMENTS 5,280,447 * 1/1994 Hazen ........................... 365/230.03
5,636,174 * 6/1997 Rao ................................. 365/230.03
5,978,302 * 11/1999 Merritt ........................... 365/230.03

FOREIGN PATENT DOCUMENTS 7-161183  6/1995 (JP).
98-4968   3/1998 (KR).

OTHER PUBLICATIONS

Saeki et al., A 2.5–ns Clock Access, 250–MHz, 256–Mb SDRAM With Synchronous Mirror Delay, IEEE Journal of Solid–State Circuits, vol. 31, No. 11, Nov. 1996, pp. 1656–1665.

* cited by examiner

*Primary Examiner*—A. Zarabian
(74) *Attorney, Agent, or Firm*—Myers Bigel Sibley & Sajovec

(57) ABSTRACT

Multi-bank integrated circuit memory devices include a plurality of banks of memory cells that are divided into pairs of sub-banks of memory cells. The sub-banks of memory cells are arranged in a plurality of rows and columns of sub-banks of memory cells. The pairs of sub-banks extend diagonally relative to the plurality of rows and columns of sub-banks of memory cells. The pairs of sub-banks of the respective banks preferably are adjacent one another and extend diagonally relative to the plurality of rows and columns of sub-banks of memory cells. By providing diagonally extending sub-banks, the row address lines that extend between respective sub-banks of each bank may occupy reduced area. More specifically, row address lines that extend between pairs of sub-banks in same adjacent rows and same adjacent columns can cross over one another to thereby allow reduced area.

19 Claims, 2 Drawing Sheets

MULTI-BANK INTEGRATED CIRCUIT MEMORY DEVICES WITH DIAGONAL PAIRS OF SUB-BANKS

FIELD OF THE INVENTION

This invention relates to integrated circuit memory devices and more particularly to multi-bank integrated circuit memory devices having a plurality of banks of memory cells.

BACKGROUND OF THE INVENTION

Integrated circuit memory devices are widely used in consumer and commercial applications. As the operational speed of Central Processing Units (CPU) continues to increase, it also may be desirable to increase the operational speed of integrated circuit memory devices. Accordingly, synchronous Dynamic Random Access Memories (DRAM) have been developed that operate in synchronization with a system clock. Moreover, multi-bank integrated circuit memory devices also have been developed in which a plurality of banks of memory cells are provided. The plurality of banks of memory cells may operate in an interleaved manner to increase the operational speed of the multi-bank integrated circuit memory devices.

As the integration density of integrated circuit memory devices continues to increase and the operational speed increases, it is known to increase the number of banks to thereby increase the effective bandwidth of the multi-bank integrated circuit memory devices. For example, a 16-Mb DRAM may include two banks, a 64-Mb DRAM may include two or four banks, a 256-Mb DRAM may include four banks and other high-speed integrated circuit memory devices such as Rambus integrated circuit memory devices may include 16 or more banks.

Prefetch schemes also may be used in synchronous DRAMs to operate at high speeds. In particular, in a synchronous DRAM having a prefetch scheme, an external address or command may be input for every two cycles of the system clock. Moreover, at least two Column Select Lines (CSL) that are selected by at least two column addresses, may be enabled for two cycles of the system clock. This operation is often called a 2N rule or a 2-bit prefetch.

In multi-bank integrated circuit memory devices, the respective banks may include independent row decoders and column decoders that operate independently. When the number of banks increases and a prefetch scheme is used, the banks may be arranged in a plurality of rows and columns of banks. Each bank generally receives its own row address information so as to be independently controlled. Accordingly, as the number of banks increases, the number of row address signal lines may also increase and the size of the integrated circuit may also increase undesirably.

It is also known to divide each bank of memory cells into two sub-banks of memory cells that are arranged in a plurality of rows and columns of sub-banks of memory cells. For example, in a publication by Saeki et al., entitled "A 2.5-ns Clock Access, 250-MHz, 256-Mb SDRAM with Synchronous Mirror Delay", IEEE Journal of Solid-State Circuits, Vol. 31, No. 11, November 1996, pages 1656–1665, a multi-bank integrated circuit memory device is described including four banks, each of which consists of two sub-banks for lower byte data and upper byte data. As illustrated in FIG. 1 of the Saeki et al. publication, the sub-banks are arranged in two rows and four columns with the two sub-banks of each bank being in the same row. Unfortunately, as the number of banks continues to increase, the number of signal lines that transmit row address information also may continue to increase and the size of the multi-bank integrated circuit memory device also may increase undesirably.

SUMMARY OF THE INVENTION

It is therefore an object of the present invention to provide improved multi-bank integrated circuit memory devices.

It is another object of the present invention to provide improved multi-bank integrated circuit memory devices wherein a plurality of banks of memory cells are divided into sub-banks of memory cells that are arranged in a plurality of rows and columns of sub-banks of memory cells.

It is still another object of the present invention to provide multi-bank integrated circuit memory devices including sub-banks of memory cells, that need not unduly increase the size of the integrated circuit due to the large number of row address lines thereof.

These and other objects are provided according to the present invention by multi-bank integrated circuit memory devices that include a plurality of banks of memory cells that are divided into pairs of sub-banks of memory cells. The sub-banks of memory cells are arranged in a plurality of rows and columns of sub-banks of memory cells. The pairs of sub-banks extend diagonally relative to the plurality of rows and columns of sub-banks of memory cells. The pairs of sub-banks of the respective banks preferably are adjacent one another and extend diagonally relative to the plurality of rows and columns of sub-banks of memory cells. By providing diagonally extending sub-banks, the row address lines that extend between respective sub-banks of each bank may occupy reduced area. More specifically, the row address lines that extend between pairs of sub-banks in same adjacent rows and same adjacent columns can cross over one another to thereby allow reduced area.

Multi-bank integrated circuit memory devices according to the present invention comprise a plurality of banks of memory cells that are divided into sub-banks of memory cells that are arranged in a plurality of rows and columns of sub-banks of memory cells. The sub-banks of at least one bank are located in different rows and different columns of sub-banks of memory cells. The sub-banks of the at least one bank preferably are located in adjacent rows and adjacent columns of sub-banks of memory cells. More preferably, the sub-banks of each bank are located in different rows and different columns from one another and most preferably, the sub-banks of each bank are located in adjacent rows and adjacent columns relative to one another.

A row decoder may be provided between adjacent sub-banks of two banks in a row of sub-banks. A column decoder also may be provided between adjacent sub-banks of the two banks in a column of sub-banks. A peripheral circuit block also may be provided adjacent one of the adjacent sub-banks of the two banks in a column of sub-banks, and opposite the column decoder.

A plurality of row address lines extends between respective sub-banks of each bank in adjacent rows and adjacent columns. The row address lines that extend between two pairs of respective sub-banks in same adjacent rows and same adjacent columns preferably cross over one another. They preferably cross over one another along the diagonals between the two pairs of sub-banks of memory cells. Accordingly, the area of the integrated circuit that is occupied by the row address lines need not increase unduly as the number of banks increases.

DETAILED DESCRIPTION OF PREFERRED EMBODIMENTS

Figure 1:
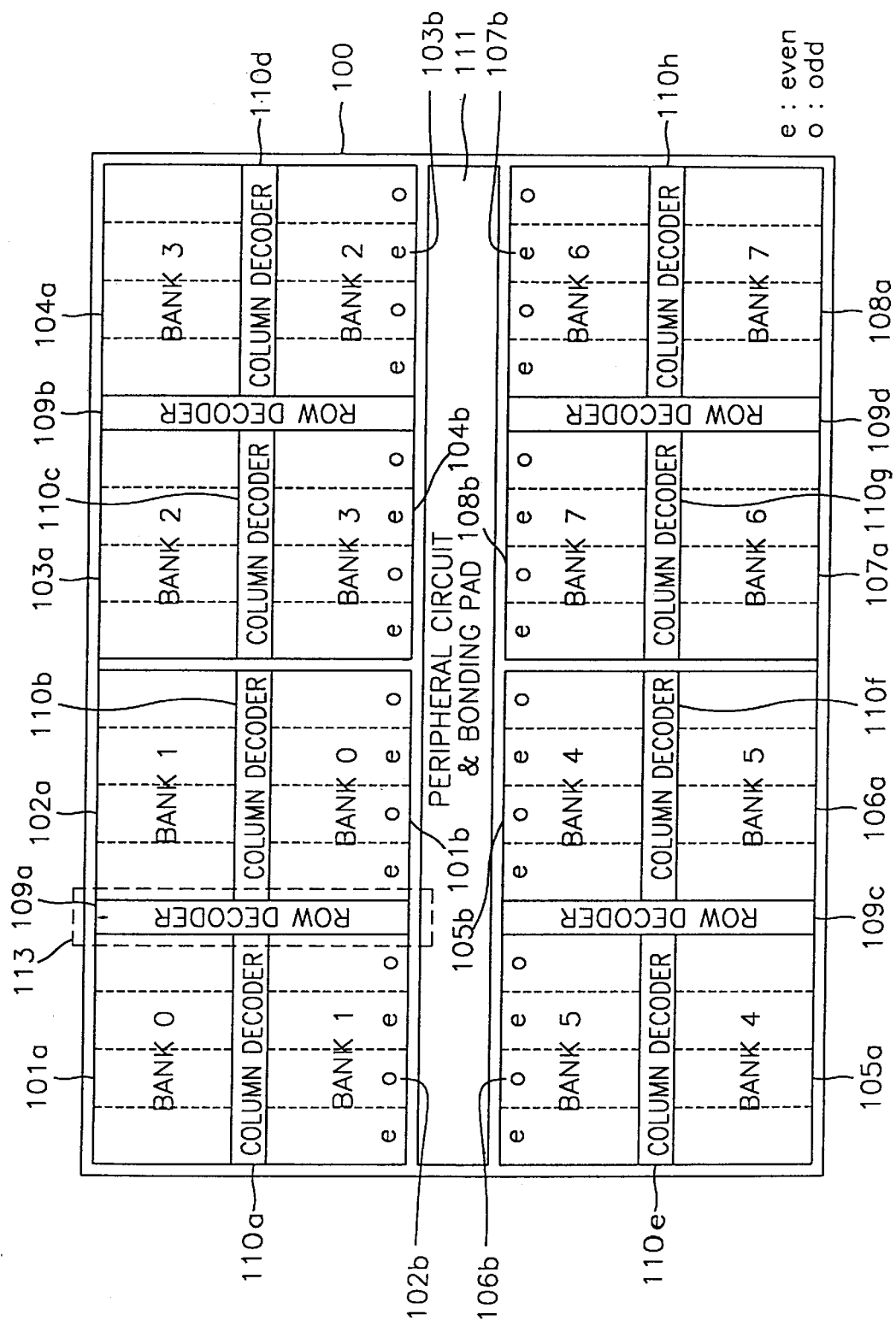
FIG. 1 illustrates multi-bank integrated circuit memory devices according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the size of regions may be exaggerated for clarity. Like numbers refer to like elements throughout. It will be understood that when an element such as a layer, region or substrate is referred to as being "on" another element, it can be directly on the other element or intervening elements may also be present.

Referring now to FIG. 1, a multi-bank integrated memory device according to the present invention includes a memory cell array which can be divided into a plurality of banks, i.e., banks 0 through 7, 101a and 101b through 108a and 108b, a plurality of column decoders 110a through 110h, row decoders 109a through 109d, and a peripheral circuit block 111. Thus, the multi-bank integrated memory device of FIG. 1 may embody an 8-bank, 2-bit prefetch architecture. Other arrangements may be provided. To provide a higher level of integration of the multi-bank memory device, bonding pads are arranged on the peripheral circuit block 111.

In particular, the respective banks are divided into two sub-banks. Two sub-banks are diagonally adjacent one another on the left and right sides of the corresponding row decoders. Another two sub-banks are also diagonally adjacent one another on the left and right sides of the corresponding row decoders, and each bank is stacked above and below the corresponding column decoders. It will be understood that, as used herein, the terms "left," "right," "above," and "below" indicate relative orientations rather than absolute directions.

Stated differently, the plurality of banks of memory cells are divided into sub-banks of memory cells 101a and 101b through 108a and 108b that are arranged in a plurality of rows and columns of sub-banks of memory cells. Thus, in FIG. 1, four horizontal rows and four vertical columns of sub-banks of memory cells are provided. It will be understood, however, that the terms "row" and "column" may be used to indicate any two directions, and need not be orthogonal. According to the invention, sub-banks of at least one bank are located in different rows and different columns of sub-banks of memory cells. Thus, for example, the sub-banks of bank 0 are located in the first row and the first column of sub-banks of memory cells and in the second row and the second column of memory cells.

Preferably, as shown in FIG. 1, the sub-banks of the at least one bank are located in adjacent rows and adjacent columns of sub-banks. More preferably, as shown in FIG. 1, the sub-banks of each bank are located in different rows and different columns from one another, and most preferably the sub-banks of each bank are located in adjacent rows and adjacent columns relative to one another.

A row decoder also is provided between adjacent sub-banks of two banks in a row of sub-banks. Thus, for example, row decoder 109a is provided between sub-bank 101a and sub-bank 102a in the first row of sub-banks. A column decoder also is provided between adjacent sub-banks of the two banks in a column of sub-banks. Thus, for example, a column decoder 110a is located between adjacent sub-banks 101a and 102b in the first column of sub-banks. A peripheral circuit block 111 also is provided adjacent one of the adjacent sub-banks of the two banks in a column of sub-banks, for example, adjacent sub-bank 102b, and opposite the column decoder 110a.

In other words, bank 0 is divided into two sub-banks 101a and 101b, bank 1 is divided into two sub-banks 102a and 102b, and the sub-banks 101a, 101b, 102a and 102b alternate on the left and right sides of the row decoder 109a. The two different sub-banks 101a and 102b arranged on the left side of the row decoder 109a are arranged above and below the column decoder 110a in a stacked structure, and the two different sub-banks 102a and 101b arranged on the right side of the row decoder 109a are stacked above and below the column decoder 110b.

Also, bank 2 is divided into two sub-banks 103a and 103b, and bank 3 is divided into two sub-banks 104a and 104b. The sub-banks 103a, 103b, 104a and 104b alternate on the left and right sides of the row decoder 109b. The two different sub-banks 103a and 104b arranged on the left side of the row decoder 109b are arranged above and below the column decoder 110c in a stacked structure, and the two different sub-banks 104a and 103b arranged on the right side of the row decoder 109b are stacked above and below the column decoder 110d.

Bank 4 is divided into two sub-banks 105a and 105b, and bank 5 is divided into two sub-banks 106a and 106b. The sub-banks 105a, 105b, 106a and 106b alternate on the left and right sides of the row decoder 109c. The two different sub-banks 105a and 106b arranged on the left side of the row decoder 109c are stacked above and below the column decoder 110e, and the two different sub-banks 106a and 105b arranged on the right side of the row decoder 109c are stacked above and below the column decoder 110f.

Bank 6 is divided into two sub-banks 107a and 107b, and bank 7 is divided into two sub-banks 108a and 108b. The sub-banks 107a, 107b, 108a and 108b alternate on the left and right sides of the row decoder 109d. The two different sub-banks 107a and 108b arranged on the left side of the row decoder 109d are stacked above and below the column decoder 110g, and the two different sub-banks 108a and 107b arranged on the right side of the row decoder 109d are stacked above and below the column decoder 110h.

In more detail, in the multi-bank memory device, the respective banks preferably have independent row decoders and column decoders and operate independently from other banks. However, when the number of banks increases and a prefetch scheme is used, as in a multi-bank memory device according to the present invention shown in FIG. 1, two different sub-banks that are on the left and right sides of the corresponding row decoder are stacked above and below the corresponding column decoder. The size of the integrated circuit memory device may be reduced thereby.

The respective banks preferably each have their own row addresses so as to be independently controlled, and corresponding signal lines for transmitting each row address information preferably are provided. If the same banks are arranged on the left and right sides of a row decoder, for example, bank 0 is arranged on the left and right sides and above the row decoder 109a and bank 1 is arranged in the left and right sides and below the row decoder 109a, the signal lines for transmitting row address information to the row decoder and control block of bank 0 may need to pass the row decoder area of bank 1. Accordingly, both the signal lines for transmitting row address information to the row decoder and control block of bank 1, and the signal lines for transmitting row address information to the row decoder and control block of bank 0 may pass through the row decoder area of bank 1. Thus, the row decoder area of bank 1 may increase and the integrated circuit size also may increase.

In contrast, in multi-bank memory devices according to the present invention as shown in FIG. 1, different banks are arranged on the left and right sides of the corresponding row decoder, and the same banks alternate on the left and right sides of the corresponding row decoder. Thus, the row address information signal lines corresponding to the two banks may cross on the boundary area between two different banks arranged on the left and right sides of the row decoder, thereby allowing reduced integrated circuit size.

Figure 2:
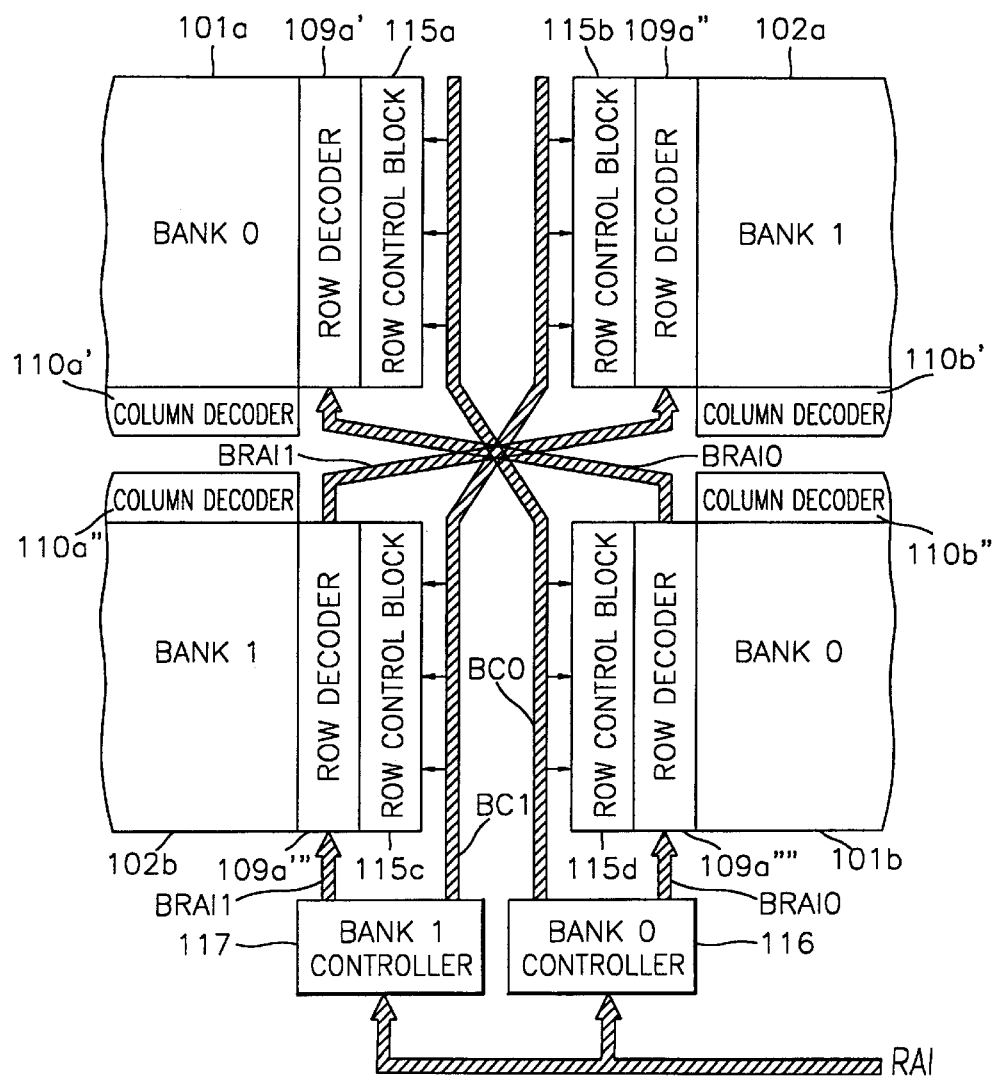
FIG. 2 is a detailed diagram of a boundary area between two different banks in a multi-bank integrated circuit memory device of FIG. 1.

FIG. 2 is a detailed diagram of the boundary area 113 between two different banks in a multi-bank semiconductor memory device according to the present invention of FIG. 1. FIG. 2 illustrates crossing of row address information signal lines as will now be described.

Referring to FIG. 2, sub-banks 101a and 101b of bank 0, and sub-banks 102a and 102b of bank 1 have independent row decoders and column decoders. In other words, sub-bank 101a of bank 0 includes a column decoder 110a', a row decoder 109a' and a row control block 115a. Sub-bank 101b of bank 0 includes a column decoder 110b", a row decoder 109a"" and a row control block 115d. Also, the sub-bank 102a of bank 1 includes a column decoder 110b', a row decoder 109a" and a row control block ll5b. Finally, the sub-bank 102b of bank 1 includes a column decoder 110a", a row decoder 109a"" and a row control block 115c.

The row address information signal lines BRAI0 and BC0, corresponding to the sub-banks 101a and 101b of bank 0, cross the row address information signal lines BRAI1 and BC1, corresponding to the sub-banks 102a and 102b of bank 1, in the boundary area of bank 0 and bank 1.

The bank 0 controller 116 generates row address information signals corresponding to the sub-banks 101a and 101b of bank 0 in response to a common row address information signal RAI, and the generated signals are transmitted to the row decoders 109a"" and 109a" and the row control blocks 115d and 115a through the signal lines BRAIO and BCO. Also, the bank 1 controller 117 generates row address information signals corresponding to the sub-banks 102a and 102b of bank 1 in response to the common row address information signal RAI, and the generated signals are transmitted to the row decoders 109a'" and 109a" and the row control blocks 115c and 115b through the signal lines BRAI1 and BC1.

Accordingly, as described above, in multi-bank memory devices according to the present invention, the respective banks may be divided into two sub-banks. The two sub-banks alternate on the left and right sides of the corresponding row decoder. Two different sub-banks arranged on the left and right sides of the corresponding row decoder are stacked above and below the corresponding row decoder. The row address information signal lines corresponding to the respective banks cross in the boundary area between the two different banks arranged on the left and right sides of the row decoder. The size of the integrated circuit memory device may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A multi-bank integrated circuit memory device comprising:

a plurality of independently controlled banks of memory cells that are divided into sub-banks of memory cells that are commonly controlled within the respective independently controlled banks and are arranged in a plurality of rows and columns of sub-banks of memory cells, the sub-banks of at least one independently controlled bank being located in different rows and different columns of sub-banks of memory cells.

2. A multi-bank integrated circuit memory device according to claim 1 wherein the sub-banks of the at least one bank are located in adjacent rows and adjacent columns of sub-banks of memory cells.

3. A multi-bank integrated circuit memory device according to claim 1 wherein the sub-banks of each bank are located in different rows and different columns from one another.

4. A multi-bank integrated circuit memory device according to claim 2 wherein the sub-banks of each bank are located in adjacent rows and adjacent columns relative to one another.

5. A multi-bank integrated circuit memory device according to claim 1 further comprising:

a row decoder between adjacent sub-banks of two banks in a row of sub-banks; and a column decoder between adjacent sub-banks of the two banks in a column of sub-banks.

6. A multi-bank integrated circuit memory device according to claim 5 further comprising:

a peripheral circuit block adjacent one of the adjacent sub-banks of the two banks in a column of sub-banks, and opposite the column decoder.

7. A multi-bank integrated circuit memory device according to claim 4 further comprising:

a plurality of row address lines that extend between respective sub-banks of each bank in adjacent rows and adjacent columns.

8. A multi-bank integrated circuit memory device according to claim 7 wherein row address lines that extend between a pair of respective sub-banks in same adjacent rows and same adjacent columns cross over one another.

9. A multi-bank integrated circuit memory device comprising:

a plurality of independently controlled banks of memory cells that are divided into pairs of sub-banks of memory cells that are commonly controlled within the respective independently controlled banks, the sub-banks of memory cells being arranged in a plurality of rows and columns of sub-banks of memory cells, the pairs of sub-banks extending diagonally relative to the plurality of rows and columns of sub-banks of memory cells.

10. A multi-bank integrated circuit memory device according to claim 9 wherein the pairs of sub-banks of the respective banks are adjacent one another and extend diagonally relative to the plurality of rows and columns of sub-banks of memory cells.

11. A multi-bank integrated circuit memory device according to claim 10 further comprising:

a row decoder between adjacent sub-banks of two banks in a row of sub-banks; and a column decoder between adjacent sub-banks of the two banks in a column of sub-banks.

12. A multi-bank integrated circuit memory device according to claim 11 further comprising:

a peripheral circuit block adjacent one of the adjacent sub-banks of the two banks in a column of sub-banks, and opposite the column decoder.

13. A multi-bank integrated circuit memory device according to claim 11 further comprising:

a plurality of row address lines that extend between respective sub-banks of each bank in adjacent rows and adjacent columns.

14. A multi-bank integrated circuit memory device according to claim 13 wherein row address lines that extend between a pair of respective sub-banks in same adjacent rows and same adjacent columns cross over one another.

15. A multi-bank integrated circuit memory device comprising:

a memory cell array having a plurality of independently controlled banks; and a plurality of column decoders and row decoders for the respective banks;

wherein a first independently controlled bank is divided into two first sub-banks that are commonly controlled within the respective independently controlled banks and are diagonally opposite each other with respect to the corresponding row decoder and column decoder, and a second independently controlled bank is divided into two second sub-banks that are diagonally opposite each other with respect to the corresponding row decoder and column decoder and are adjacent the two first sub-banks.

16. A multi-bank integrated circuit memory device according to claim 15 further comprising:

a peripheral circuit block adjacent one of the two first sub-banks and one of the two second sub-banks, and opposite the corresponding column decoders.

17. A multi-bank integrated circuit memory device according to claim 16 further comprising:

a plurality of row address lines that extend between the two first sub-banks and extend between the second two sub-banks.

18. A multi-bank integrated circuit memory device according to claim 17 wherein the row address lines that extend between the two first sub-banks and extend between the second two sub-banks cross over one another.

19. A multi-bank integrated circuit memory device according to claim 17 wherein the row address lines that extend between the two first sub-banks and extend between the second two sub-banks cross over one another between the one of the two first sub-banks and the one of the two second sub-banks.

* * * * *